United States Patent [19]
Gardner et al.

[11] Patent Number: 5,300,175
[45] Date of Patent: Apr. 5, 1994

[54] METHOD FOR MOUNTING A WAFER TO A SUBMOUNT

[75] Inventors: Lawrence R. Gardner; Michael P. Norman, both of Chandler; Robert W. Griffith, Jr., Mesa, all of Ariz.

[73] Assignee: Motorola, Inc., Schaumburg, Ill.

[21] Appl. No.: 82

[22] Filed: Jan. 4, 1993

[51] Int. Cl.⁵ .................. B32B 31/20; H01L 21/447
[52] U.S. Cl. .................. 156/285; 148/DIG. 12;
156/160; 156/286; 156/381; 437/212
[58] Field of Search ............... 156/285, 286, 311, 382,
156/160, 494; 437/209, 212; 148/DIG. 12;
118/728, 730

[56] References Cited

U.S. PATENT DOCUMENTS

| | | | |
|---|---|---|---|
| 3,322,598 | 5/1967 | Marks et al. | |
| 3,475,867 | 11/1969 | Walsh | 51/277 |
| 3,492,763 | 2/1970 | Walsh | 51/277 |
| 4,152,188 | 5/1979 | Friedrich et al. | |
| 4,283,242 | 8/1981 | Regler | 156/382 |
| 4,316,757 | 2/1982 | Walsh | 156/286 |
| 4,714,511 | 12/1987 | Nakao | 156/382 |
| 4,752,180 | 6/1988 | Yoshikawa | 414/737 |
| 5,129,827 | 7/1992 | Hoshi | 148/DIG. 12 |

FOREIGN PATENT DOCUMENTS

| | | | |
|---|---|---|---|
| 6271215A | 9/1985 | Japan . | |
| 1-004013 | 1/1989 | Japan . | |
| 2-056918 | 3/1989 | Japan | 148/DIG. 12 |
| 1-169917 | 7/1989 | Japan . | |

*Primary Examiner*—Michael W. Ball
*Assistant Examiner*—Daniel J. Stemmer
*Attorney, Agent, or Firm*—Rennie William Dover; Joe E. Barbee

[57] ABSTRACT

A semiconductor wafer (40) is placed in a first pressure chamber (37) of a bonding apparatus (10 or 60). A major surface (46) of a submount (44) is placed on a submount support (30 or 62). The major surface (46) of the submount (44) seals the first pressure chamber (37). A pressure differential is generated between the first pressure chamber (37) and a second pressure chamber (47) The pressure differential bows a central portion of the submount (44) toward the semiconductor wafer (40). The central portion of the submount (44) contacts an adhesive coating over a central portion of the semiconductor wafer (40). The submount support (30 or 62) is displaced to decrease a curvature on the submount (44). The pressure differential is increased to an end-point to facilitate bond formation between the semiconductor wafer (40) and the submount (44).

13 Claims, 3 Drawing Sheets

METHOD FOR MOUNTING A WAFER TO A SUBMOUNT

BACKGROUND OF THE INVENTION

This invention relates, in general, to bonding together two surfaces, and more particularly, to methods of bonding a wafer to a submount.

Semiconductor manufacturers are constantly refining their fabrication processes to optimize semiconductor device performance while minimizing manufacturing costs and cycle time. Dual-side wafer processing is one approach to improving semiconductor device performance while maintaining relatively low manufacturing costs. For example, a semiconductor wafer may have a front-side and a back-side, wherein the front-side has undergone a series of processing steps. Subsequently, the front-side may be bonded to a submount with an adhesive material to allow processing of the back-side. Back-side processing may include grinding the back-side to thin the semiconductor wafer, or formation of semiconductor devices in the back-side. The submount provides protection to the front-side during the back-side processing as well as serving as a "handle" which supports the wafer and allows automated handling.

Many back-side processing steps require the backside of the semiconductor wafer to be flat and that a thickness of the adhesive material between the semiconductor wafer and the submount be uniform. Accordingly, it would be advantageous to have a method for bonding a semiconductor wafer to a submount such that the thickness of the adhesive material between the semiconductor wafer and the submount is uniform. Further, it is desirable that voids between the semiconductor wafer and the submount are not produced. More particularly, the method should eliminate gas bubbles that may form voids. In addition, the method should be easily integrated into a wafer processing flow.

SUMMARY OF THE INVENTION

Briefly stated, this invention is a method for mounting a wafer to a submount. A bonding apparatus is provided having a first pressure chamber into which a chuck extends, a second pressure chamber, and a submount support between the first and the second pressure chambers. A wafer having an adhesive layer is placed on the chuck wherein a side without the adhesive layer contacts the chuck. A submount is placed on the submount support. A pressure differential is created between the first pressure chamber and the second pressure chamber, wherein the pressure differential bows the submount support towards the wafer. The bowed portion of the submount contacts the adhesive layer. A curvature of the bowed portion is modulated or controlled to prevent breaking the submount.

DETAILED DESCRIPTION OF THE DRAWINGS

Figure 1:
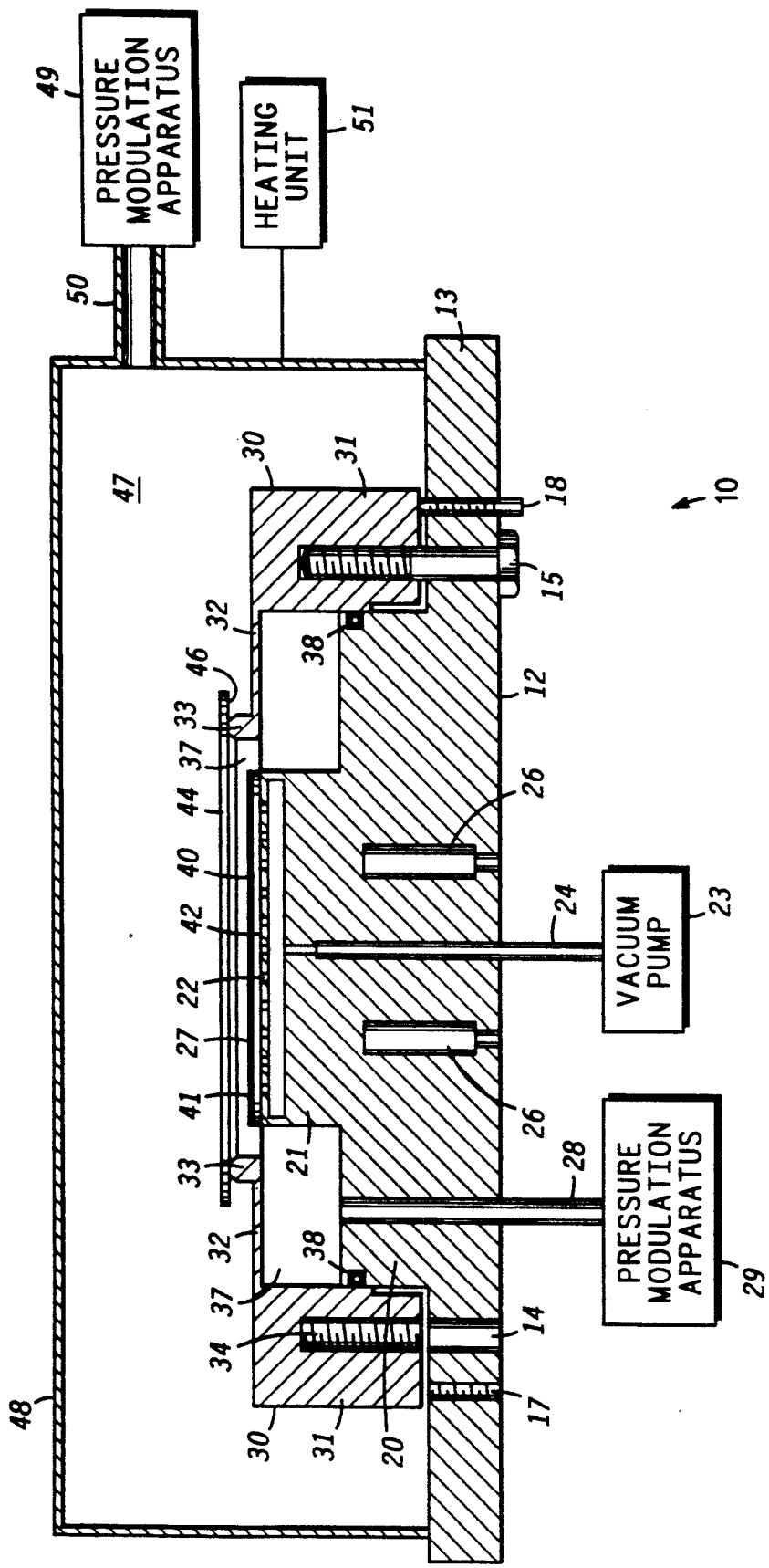
FIG. 1 is a cross-sectional side view of a first embodiment of a wafer bonding apparatus in accordance with the present invention.

Prior to performing the step of bonding in accordance with the present invention a substrate 40 such as a semiconductor wafer (shown in FIGS. 1 and 3) having a major surface 41 and a major surface 42 is provided. Major surface 41 and major surface 42 are hereby defined herein as a front-side and a back-side of semiconductor wafer 40, respectively. Front-side 41 is coated with an adhesive material 27 (shown in FIGS. 1 and 3). Methods and materials for coating front-side 41 in preparation for wafer bonding are well known to those skilled in the art. For example, a wax coating 27 may be applied in accordance with U.S. Pat. No. 3,475,867, entitled PROCESSING OF SEMICONDUCTOR WAFERS, using a wax as described in U.S. Pat. No. 3,492,763, entitled METHOD AND APPARATUS FOR MOUNTING SEMICONDUCTOR SLICES, both hereby incorporated herein by reference.

Referring now to FIG. 1, a cross-sectional side view of a first embodiment of a bonding apparatus 10 in accordance with the present invention is shown. Bonding apparatus 10 includes a chuck 12 and a submount support 30 which cooperates with chuck 12 to form a first pressure chamber 37 or a first cavity. In a first embodiment, chuck 12 comprises three concentric circular tiers. A first concentric circular tier 13 serves as a fastening tier wherein submount support 30 is fastened to circular tier 13. Fastening tier 13 has a set of unthreaded screw holes 14 into which cap screws 15 are inserted. Adjacent each unthreaded screw hole 14 is a threaded screw hole 17 into which a set screw 18 is inserted. Unthreaded screw holes 14 and threaded screw holes 17 traverse an entire thickness of fastening tier 13. To more clearly illustrate the screw holes of the first embodiment, cap screws 15 and set screws 18 are not shown in unthreaded screw holes 14 and threaded screw holes 17, respectively, on the left half of FIG. 1. Although not shown, it is preferred that there be three or more sets of screw holes 14 and 17 to facilitate leveling submount support 30 as subsequently explained.

A second concentric circular tier 20 serves as a lower vertical boundary of a pressure chamber 37. Circular tier 20 extends upward from fastening tier 13 and has a smaller diameter than fastening tier 13.

A third concentric circular tier 21 serves as a semiconductor wafer mount. Wafer mount 21 extends upward from circular tier 20 and has a smaller diameter than circular tier 20. Wafer mount 21 has a plurality of concentric openings 22 which are connected to a vacuum pump 23 by a hold-down vacuum port 24.

In addition, chuck 12 may have a set of temperature control units 26 capable of maintaining chuck 12 at a temperature ranging between approximately 0° and approximately 600 degrees Celsius(° C.). Thus, chuck 12 may be a temperature controlled chuck. The temperature at which chuck 12 is maintained is selected to permit reflow of adhesive material 27. Further, chuck 12 includes a port 28 which extends from pressure modulation apparatus 29 to circular tier 20. Pressure modulation apparatus 29 may be a pump such as a piston pump, a turbo-pump, or the like. Preferably, pressure modulation apparatus 29 is capable of generating a pressure ranging from approximately ambient pressure to full vacuum. Pumps are well known in the art.

Figure 2:
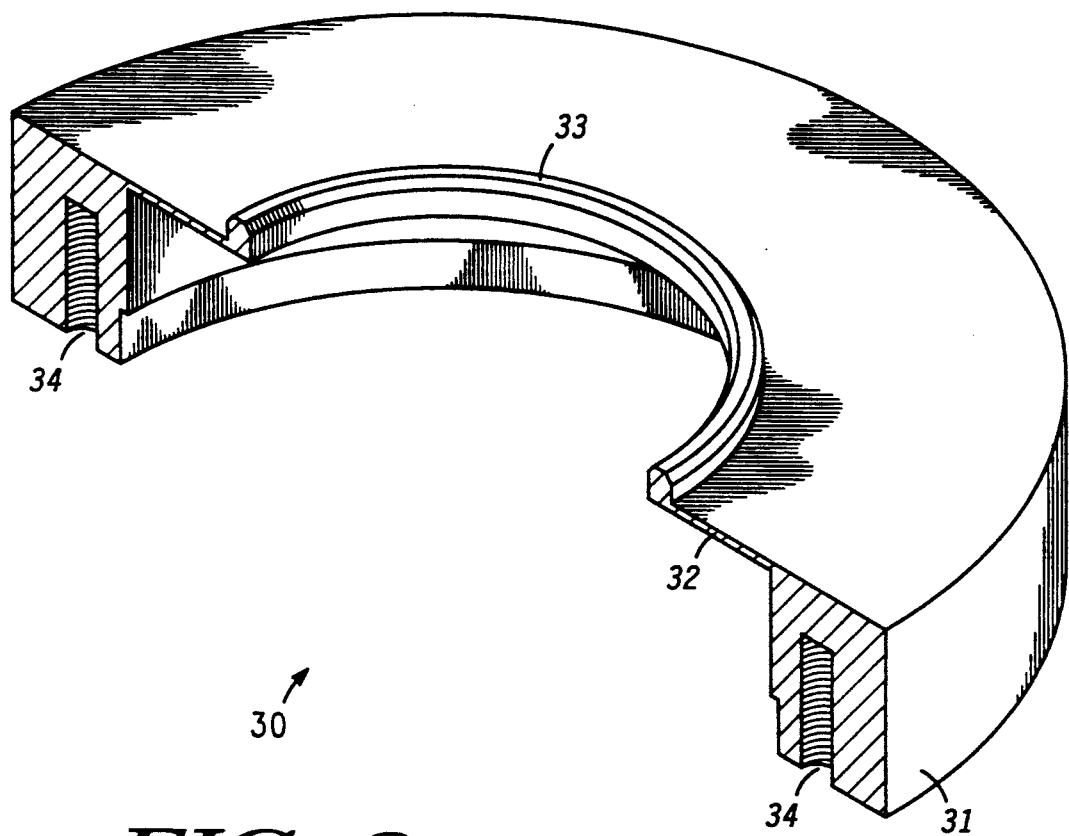
FIG. 2 is a cross-sectional perspective view of a portion of a support used in the present invention.

Referring now to FIG. 2 and in accordance with the first embodiment, submount support 30 is an annular structure comprising a base portion 31 having a flexible projection 32 extending towards a center of annular base portion 31. Flexible projection 32 has a protrusion 33 which extends from a top surface of flexible projection 32. Protrusion 33 may be coated with a dielectric material such as a resin comprising tetrafluoroethylene sold under the trademark Teflon. Further, submount support 30 has a set of threaded screw holes 34 for alignment with the set of unthreaded screw holes 14 in fastening tier 13. Cap screws 15 are screwed into threaded screw holes 34 (shown in FIG. 1).

Referring again to FIG. 1, submount support 30 is mounted to chuck 12, wherein threaded screw holes 34 are aligned with unthreaded screw holes 14. Cap screws 15 are inserted through each unthreaded screw hole and screwed into screw holes 34. Cap screws 15 serve to secure submount support 30 to chuck 12 and, in combination with set screws 18, provide a desired vertical spacing between flexible projection 32 and wafer mount 21. Cap screws 15 are tightened after the vertical positioning of submount support 30 is adjusted using set screws 18.

Mounting submount support 30 to chuck 12 creates first pressure chamber 37. Base portion 31 of submount support 30 forms a lateral boundary of pressure chamber 37 and flexible projection 32 forms a portion of an upper vertical boundary of pressure chamber 37. Second concentric circular tier 20 and wafer mount 21 form a lower vertical boundary of pressure chamber 37. Although submount support 30, flexible projection 32, and protrusion 33 each appear as a plurality of structures in FIG. 1, in the first embodiment these elements form a unitary structure, as shown in FIG. 2. Since submount support 30 moves relative to chuck 12, it is desirable to have a seal 38 between submount support 30 and chuck 12 to prevent leaks to or from pressure chamber 37.

In operation, set screws 18 are screwed into threaded screw holes 17, extending through fastening tier 3 and pushing up on submount support 30. Set screws 18 elevate submount support 30 to provide a desired vertical spacing between flexible projection 32 and wafer mount 21. In addition, set screws 18 serve to level flexible projection 32 relative to wafer mount 21. More particularly, set screws 18 provide a desired vertical spacing and leveling of a semiconductor wafer 40 and a submount 44 when positioned on wafer mount 21 and submount support 30, respectively. Initially, semiconductor wafer 40 and submount 44 should be spaced apart substantially equidistant along wafer mount 21 and flexible projection 32, respectively. In other words, it is preferable that initially semiconductor wafer 40 and submount 44 be substantially parallel. Once set screws 18 are adjusted to provide the desired spacing and leveling of flexible projection 32 relative to wafer mount 21, cap screws 15 are tightened to secure submount support 30 to chuck 12.

A semiconductor wafer 40 having a back-side 42 is provided wherein back-side 42 is placed on wafer mount 21 covering concentric openings 22. Thus, back-side 42 is placed on chuck 12. Concentric openings 22, which are connected to vacuum pump 23, enable suction created by vacuum pump 23 to pull semiconductor wafer 40 towards wafer mount 21, thereby holding semiconductor wafer 40 in position on wafer mount 21. Thus vacuum 23 is enabled, securing semiconductor wafer 40 to wafer mount 21. Temperature control units 26 are adjusted to a temperature that permits re-flow of adhesive material 27.

A submount 44 is provided and placed on submount support 30, thus submount support 30 serves as a means for supporting the submount. Submount 44 has a major surface 46 which is hereby defined herein as a bottom surface. More particularly, bottom surface 46 is placed on protrusion 33. Submount 44 forms a portion of the upper vertical boundary of pressure chamber 37. Thus bottom surface 46 of submount 44 is placed on submount support 30 such that submount 44 rests freely on submount support 30, and in particular on protrusion 33.

Preferably, submount 44 is a silicon semiconductor wafer having a larger diameter than semiconductor wafer 40. Thus, the present invention provides a method for bonding one wafer to another wafer. The larger diameter feature provides protection of semiconductor wafer 40 during wafer processing steps as well as permitting processing with standard cassette to cassette wafer equipment. Other suitable materials for submount 44 include ceramics such as alumina, or semiconductors such as gallium arsenide. Factors in choosing the type of material for submount 44 include the desired matching of the coefficients of thermal expansion between submount 44 and semiconductor wafer 40 and the desired mechanical strength and elasticity of submount 44.

Submount 44 is positioned such that a central portion of submount 44 is opposite a central portion of semiconductor wafer 40. Placing submount 44 on protrusion 33 seals pressure chamber 37 of bonding apparatus 10. It shall be understood that submount 44 rests on protrusions 33 rather than being clamped or fastened to submount support 30. Although hermetically sealing pressure chamber 37 is preferred, it is not a requirement of the present invention, thus the seal formed by placing submount 44 on protrusion 33 is adequate for the present invention. In the event of a nonhermetic seal, continuous pumping may be required to maintain pressure cavity 37 at the desired pressure.

Still referring to FIG. 1, second pressure chamber 47, also referred to as a second cavity, is formed by attaching a pressure vessel 48 to chuck 12, thereby enclosing the means for supporting submount 44 as well as semiconductor wafer 40. Submount support 30 is between first pressure chamber 37 and second pressure chamber 47. Pressure vessel 48 is connected to a pressure modulation apparatus 49 by a port 50. Preferably, pressure modulation apparatus 49 is capable of generating pressures ranging from a full vacuum to greater than 760 millimeters (mm) of mercury (one atmosphere). Pressure modulation apparatus 49 may be a pump such as a piston pump, a turbo-pump, or the like. In addition, pressure vessel 48 may be connected to a temperature control apparatus such as a heating unit 51 to control the temperature within pressure chamber 47.

In an example of the operation of the first embodiment, both pressure modulation apparatus 29 and 49 are enabled to lower a pressure within pressure chambers 37 and 47, respectively. It is desirable that pressure modulation apparatus 29 and 49 lower the pressures at substantially the same rate stopping at substantially the same pressure. In the first embodiment, pressure chambers 37 and 47 are pumped down to approximately 1 mm of mercury or less and allowed to equilibrate at this pressure. Lowering the pressure in pressure chambers 37 and 47 to approximately 1 mm of mercury decreases the number of contaminants inside these pressure chambers and promotes outgassing from pressure chambers 37 and 47. In particular the number of contaminants between front-side 41 and bottom surface 46 may be lowered and outgassing from adhesive material 27 occurs.

After equilibration, the pressure within pressure chamber 47 is increased to create a pressure differential between pressure chambers 37 and 47. The pressure differential created by pressure modulation apparatus 29 and 49 serves as a means for bowing submount 44. The pressure differential causes submount 44 to bow downward or become concave with a central portion of submount 44 being the first portion of submount 44 to extend toward adhesive material 27. Thus, the central portion of submount 44 extends from a curve in bottom surface 46 towards a central portion of semiconductor wafer 40. In addition, a combination of the pressure differential and a force of the bowing of submount 44 vertically displaces flexible projection 32 so it moves towards semiconductor wafer 40. Displacement or movement of flexible projection 32 decreases a curvature of the concave portion of submount 44 once initial contact has occurred, and thus serves to modulate or control the curvature of the submount.

An increase in the pressure differential between pressure chambers 37 and 47 continues the bowing of submount 44 and projection 32 until a substantially central portion of submount 44 contacts adhesive material 27 over a substantially central portion of semiconductor wafer 40. The joining or contacting of submount 44 and the adhesive material on semiconductor wafer 40 spreads in a radial direction towards the periphery of front-side 41 of semiconductor wafer 40 as the pressure differential is further increased. The rate at which submount 44 contacts adhesive material 27 is controlled by the rate at which the pressure differential between pressure chambers 37 and 47 is increased. These two parameters, in turn, are determined by the particular adhesive selected. It should be understood that each adhesive material has a different viscosity, thermal conductivity, adhesive characteristics, and thermal expansion characteristics.

Since chuck 12 and semiconductor wafer 40 are at the re-flow temperature of adhesive material 27 and contact initially occurs over a central portion of semiconductor wafer 40 spreading radially, bond formation between submount 44 also occurs in a radial direction.

As the pressure differential between pressure chambers 37 and 47 is increased to the end-point pressure differential, a larger portion of submount 44 becomes bonded to semiconductor wafer 40. Thus, the reaction force required between submount 44 and flexible projection 32 to lower the curvature of the concave portion must be decreased or submount 44 may break.

At the end-point pressure differential, a thickness of adhesive material 27 becomes substantially uniform between bottom surface 46 and front-side 41. In other words, at the end-point pressure differential a tangent line of the curvature of bottom surface 46 at the edge of semiconductor wafer 40 has a slope approximately equal to zero.

In analogy, submount support 30 inherently decreases the reaction force on submount 44 by acting as a nonlinear spring with a spring constant having a negative differential. In other words, as the surface area of submount 44 bonded to semiconductor wafer 40 increases due to an increased pressure differential, the upward vertical reaction of flexible projection 32 decreases.

After an end-point pressure differential has been reached, it is maintained while bringing the temperature of wafer mount 21 to a value below the re-flow temperature of adhesive material 27 thereby allowing completion of the bonding of semiconductor wafer 40 to submount 44. Thus, the bowing of submount 44 is terminated when a tangent line of the curvature at an edge of semiconductor wafer 40 has a slope of approximately zero. Subsequently, the pressure within concentric openings 22 is increased to that of pressure chamber 37. The pressure within pressure chamber 37 and concentric openings 22 is increased to that of pressure chamber 47. The pressures within pressure chambers 37 and 47 are then returned at the same rate to an ambient pressure. The mounted semiconductor wafer may be removed from bonding apparatus 10.

Figure 3:
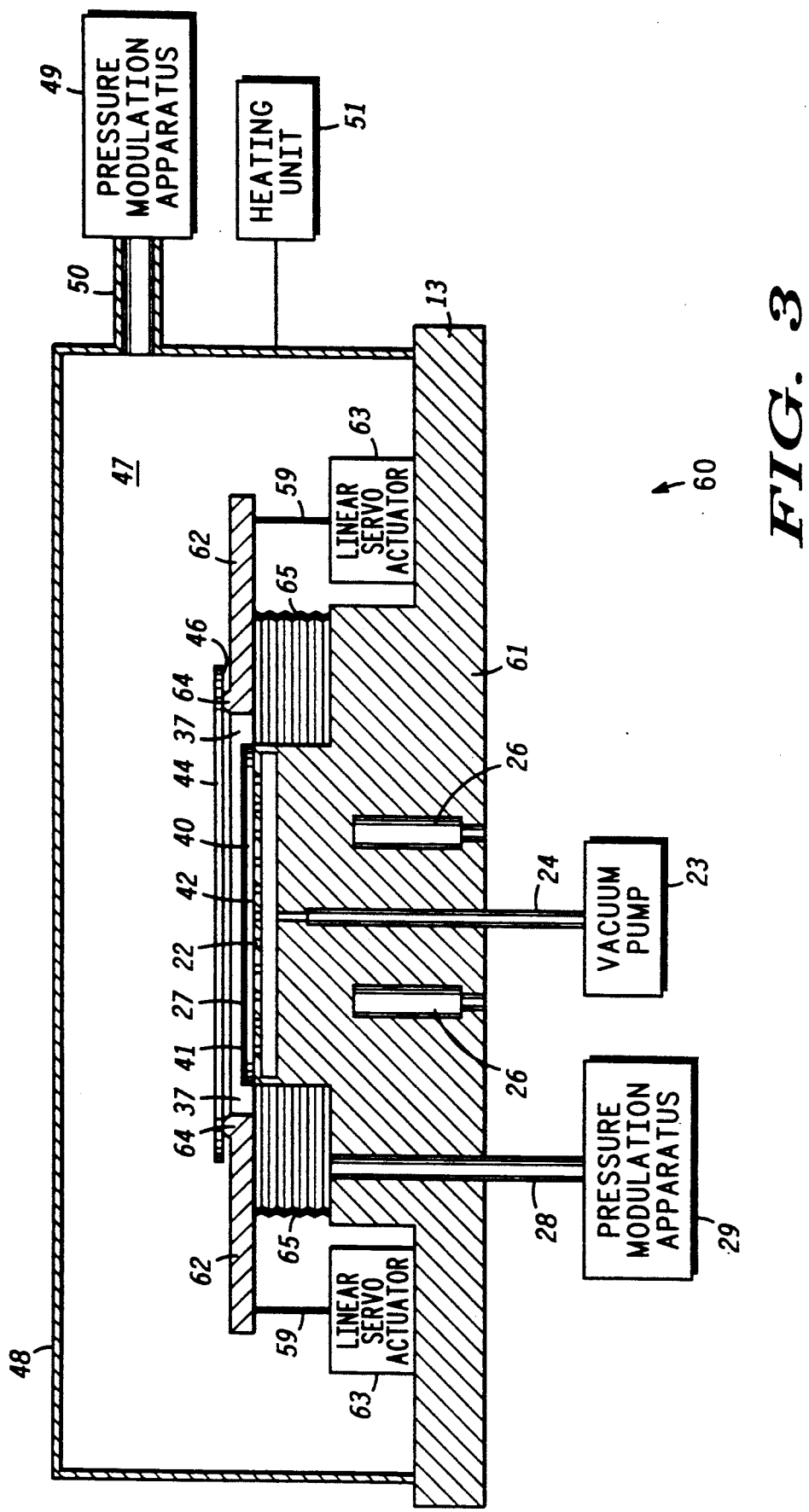
FIG. 3 is a cross-sectional side view of a second embodiment of a wafer bonding apparatus in accordance with the present invention.

Referring now to FIG. 3, a cross-sectional side view of a second embodiment of a bonding apparatus 60 in accordance with the present invention is shown. The features of bonding apparatus 60 which are identical to those of bonding apparatus 10 (FIG. 1) have retained the reference numerals from FIG. 1 to aid in understanding the present invention. Features of bonding apparatus 60 identical to those of bonding apparatus 10 include pressure chamber 37, pressure modulation apparatus 29, port 28, temperature control units 26, hold-down vacuum port 24, openings 22, vacuum pump 23, semiconductor wafer 40, front-side 41, back-side 42, adhesive material 27, submount 44, bottom surface 46, pressure chamber 47, pressure vessel 48, pressure modulation apparatus 49, port 50, and heating unit 51. Chuck 61 of the second embodiment is similar to that of the first embodiment, except that it does not have unthreaded screw holes 14 and threaded screw holes 17.

In bonding apparatus 60, a rigid annular submount support 62 cooperates with three linear servo actuators 63. Although only two linear servo actuators are shown in FIG. 3, it shall be understood that a view of the third linear servo actuator is obscured by chuck 61. Rigid annular submount support 62 is preferably a stainless steel disk, with means to couple with actuator rods 59 and having a rigid projection extending towards the center of the disk. The means to couple with actuator rods 59 may be, for example, a spherical coupling. Rigid projection 62 has a protrusion 64 which extends from a top surface of rigid projection 62. Similar to protrusion 33, protrusion 64 may be coated with a dielectric material such as a resin comprising tetrafluoroethylene.

The three linear servo actuators 63 serve as means for moving rigid annular submount support 62. It is desirable to have three linear servo actuators 63 so that rigid annular submount support 62 may be adjusted vertically and so that bottom surface 46 may be made substantially parallel to front-side 41. Linear servo actuators are well known in the art. Like the flexible projection 32 of the first embodiment, rigid annular submount support 62 forms a portion of a top boundary of pressure chamber 37.

Pressure chamber 37 is peripherally bounded by a bellows 65. Bellows 65 is attached to a lower surface of rigid annular submount support 62 in a manner that seals pressure chamber 37 along the interface between rigid annular submount support 62 and bellows 65. Preferably annular submount support 62 is a single continuous structure and bellows 65 is a single continuous structure.

In an example of the operation of the second embodiment, a front-side 41 of semiconductor wafer 40 is placed on wafer mount 21 covering openings 22. Vacuum pump 23 is enabled, creating a vacuum that holds semiconductor wafer 40 to wafer mount 21. A bottom surface 46 of a submount 44 is placed on protrusions 64. Submount 44 freely rests on protrusions 64 rather than being clamped or fastened to rigid annular submount support 62. Linear servo actuators 63 are actuated to adjust rigid annular submount support 62 so that front-side 41 and bottom surface 46 are spaced apart by a desired distance and are substantially parallel or equidistant from one another. Pressure vessel 48 is mounted in position on bonding apparatus 60, forming pressure chamber 47, and enclosing the means for supporting submount 44 as well as semiconductor wafer 40. Pressure chamber 47 is coupled to pressure modulation apparatus 49 by port 50. Pressure modulation apparatus 29 and 49 are pumps as described in the first embodiment.

The pressures within pressure chambers 37 and 47 are reduced to, for example, approximately 1 mm mercury or less in the same manner as described for the first embodiment using bonding apparatus 10. After equilibration at the desired pressure, the pressure within pressure chamber 47 is increased to create a pressure differential between pressure chambers 37 and 47. The pressure differential causes submount 44 to bow downward or become concave with a central portion of submount 44 being the first portion of submount 44 to extend out of a plane of bottom surface 46. Thus, the central portion of submount 44 extends towards a central portion of semiconductor wafer 40.

A further increase in pressure within pressure chamber 47 continues the bowing of submount 44 until a substantially central portion of submount 44 contacts adhesive material 27 over a substantially central portion of semiconductor wafer 40. The joining or contacting of submount 44 and the adhesive material on semiconductor wafer 40 spreads in a radial direction towards the periphery of semiconductor wafer 40 as the pressure within pressure chamber 47 is further increased. Thus, submount 44 becomes bonded to semiconductor wafer 40 with the bond forming in a radial direction.

As the pressure differential between pressure chambers 37 and 47 is increased to the end-point pressure differential, a larger portion of submount 44 becomes bonded to semiconductor wafer 40. The curvature of the submount increases. Thus, the reaction force required between submount 44 and rigid projection 62 to lower the curvature of the concave portion must be decreased or submount 44 may break. To decrease this curvature, linear servo actuators 63 move rigid annular submount support 62 in a downward vertical direction towards a plane comprising front-side 41. Linear servo actuators 63 continue moving rigid annular submount support 62 in proportion to the bowing of submount 44 to allow bond formation between submount 44 and semiconductor wafer 40 to continue in a radial direction while preventing submount 44 from breaking. The movement of rigid annular submount support 62 never reaches or exceeds the plane of front-side 41. In other words, the movement of rigid annular submount support 62 always proceeds such that submount 44 is bowed. Further, each linear servo actuator 63 moves at the same rate relative to one another to maintain the equal distance between front-side 41 and the non-bowed portion of bottom surface 46.

As in the first embodiment, a thickness of adhesive material 27 is substantially uniform between bottom surface 46 and front-side 41 at the end-point pressure differential. In other words, at the end-point pressure differential a tangent line of the curvature at the edge of semiconductor wafer 40 and along bottom surface 46 have a substantially constant slope of approximately zero.

Upon reaching the end-point pressure differential, linear servo actuators 63 stop, and the pressure differential is maintained while bringing the temperature of wafer mount 61 to a value below the re-flow temperature of adhesive material 27 thereby allowing completion of the bonding of semiconductor wafer 41 to submount 46. Subsequently, the pressure within concentric openings 22 is increased to that of pressure chamber 37. The pressure within pressure chamber 37 and concentric openings 22 is increased to that of pressure chamber 47. The pressures within pressure chambers 37 and 47 are then returned to an ambient pressure at the same rate. The mounted semiconductor wafer may be removed from bonding apparatus 10.

Although the discussion of the present invention describes bonding a semiconductor wafer to a submount, it shall be understood that substrates other than semiconductor wafers may be coated with an adhesive material and bonded to a submount. Further, submounts and the substrates to which the substrates are bonded may have shapes other than annular or circular. It shall be further understood that an adhesive material may be applied to a center portion of the submount.

By now it should be appreciated that there has been provided a method for bonding a semiconductor wafer to a submount. Further, the bonding method may be performed starting at a desired initial pressure within the two pressure chambers. For example, bonding may be performed at reduced pressures thereby eliminating any gases that may be present in the adhesive material. Thus, bonding at a lower pressure promotes a more uniform bond and helps to provide a bonded semiconductor having a flat and parallel surface relative to that of the submount.

We claim:

1. A method for mounting a wafer to a submount, comprising the steps of:

providing a bonding apparatus, wherein the boundary apparatus comprises a chuck, a first pressure chamber having a portion of the chuck as a vertical boundary and a second pressure chamber, the first and second pressure chambers having a submount support therebetween;

providing a wafer, the wafer having a first major surface and a second major surface wherein the second major surface is coated with an adhesive material;

placing the first major surface of the wafer on the chuck;

providing a submount, the submount having a major surface;

placing the major surface of the submount on the submount support so that the submount rests freely on the submount support and the major surface of the submount is spaced apart from the adhesive material;

bowing the major surface of the submount and forming a curvature therein until the major surface of the submount contacts the adhesive material on the second major surface of the wafer; and modulating the curvature of the major surface of the submount after the submount has contacted the adhesive material, wherein the step of modulating the curvature includes moving at least a portion of the submount support.

2. A method for mounting a wafer to a submount as claimed in claim 1 wherein the steps of bowing the major surface of the submount and contacting the adhesive material includes generating a pressure differential between the first and the second pressure chambers.

3. A method for mounting a wafer to a submount as claimed in claim 1 wherein the step of contacting the major surface of the submount includes contacting a substantially central portion of the first major surface of the submount with the adhesive material over a substantially central portion of the second major surface of the wafer.

4. A method for mounting a wafer to a submount as claimed in claim 3 wherein the step of contacting a major surface includes spreading the contact radially to a periphery of the second major surface of the wafer.

5. A method for mounting a wafer to a submount as claimed in claim 1 wherein the step of providing the submount support includes providing the submount support having a flexible projection.

6. A method for mounting a wafer to a submount as claimed in claim 1 wherein the step of providing the submount support includes providing means for moving the submount support.

7. A method for mounting a wafer to a submount as claimed in claim 1 wherein the step of providing a wafer includes providing a wafer comprising a semiconductor material.

8. A method for bonding a first wafer to a second wafer, comprising the steps of:

providing a first cavity, the first cavity having a wafer mount;

providing the first wafer wherein the first wafer has a first major surface and a second major surface, the second major surface covered by an adhesive material;

placing the first major surface of the first wafer on the wafer mount;

providing the second wafer wherein the second wafer has a major surface;

providing means for supporting the second wafer;

placing the major surface of the second wafer on the means for supporting the second wafer such that the second wafer rests freely on the means for supporting the second wafer;

providing a second cavity wherein the second cavity encloses the means for supporting the second wafer and the second wafer;

bowing the second wafer and forming a curvature therein until the major surface of the second wafer contacts the adhesive material covering the second major surface of the first wafer; and modulating the curvature of the major surface of the second wafer after the second wafer has contacted the adhesive material.

9. A method for bonding a first wafer to a second wafer as claimed in claim 8 wherein the step of controlling a curvature of the major surface of the second wafer includes terminating the step of bowing the second wafer when a tangent line of the curvature of the major surface of the second wafer at an edge of the first wafer has a slope of approximately zero.

10. A method for bonding a first wafer to a second wafer as claimed in claim 8 wherein the step of bowing the second wafer includes generating a pressure differential between the first cavity and the second cavity.

11. A method for bonding a first wafer to a second wafer as claimed in claim 8 wherein the step of controlling a curvature of the major surface of the second wafer includes moving the means for supporting the second wafer in a direction toward a plane comprising the second major surface of the first wafer.

12. A method for bonding a first wafer to a second wafer as claimed in claim 8 wherein the step of providing means for supporting the second wafer includes providing the means for supporting the second wafer having a flexible projection.

13. A method for bonding a first wafer to a second wafer as claimed in claim 8 wherein the step of bowing the second wafer includes contacting a central portion of the second wafer with a central portion of the first wafer with the contact spreading radially outward toward a periphery of the first wafer.

* * * * *

UNITED STATES PATENT AND TRADEMARK OFFICE
CERTIFICATE OF CORRECTION

PATENT NO. : 5,300,175
DATED : April 5, 1994
INVENTOR(S) : Lawrence R. Gardner et al.

It is certified that error appears in the above-indentified patent and that said Letters Patent is hereby corrected as shown below:

Column 8, claim 1, line 44, change "boundary" to --bonding--.

Signed and Sealed this

Twenty-sixth Day of July, 1994

Attest:

BRUCE LEHMAN

*Attesting Officer*     *Commissioner of Patents and Trademarks*